(12) United States Patent
Cook et al.

(10) Patent No.: US 10,544,039 B2
(45) Date of Patent: Jan. 28, 2020

(54) METHODS FOR DEPOSITING A MEASURED AMOUNT OF A SPECIES IN A SEALED CAVITY

(71) Applicant: TEXAS INSTRUMENTS INCORPORATED, Dallas, TX (US)

(72) Inventors: Benjamin Stassen Cook, Addison, TX (US); Kurt Wachtler, Richardson, TX (US); Adam Joseph Fruehling, Garland, TX (US); Juan Alejandro Herbsommer, Allen, TX (US); Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/698,706

(22) Filed: Sep. 8, 2017

(65) Prior Publication Data

US 2019/0077656 A1  Mar. 14, 2019

(51) Int. Cl.
| | |
|---|---|
| *H01L 21/00* | (2006.01) |
| *B81C 1/00* | (2006.01) |
| *G04F 5/14* | (2006.01) |
| *B81B 3/00* | (2006.01) |

(52) U.S. Cl.
CPC ............ *B81C 1/00793* (2013.01); *G04F 5/14* (2013.01); *B81B 3/0089* (2013.01); *B81B 2201/058* (2013.01); *B81B 2203/0315* (2013.01); *H01L 21/00* (2013.01)

(58) Field of Classification Search
CPC .................... B81C 1/00793; G04F 5/14; B81B 2203/0315; B81B 2201/058; B81B 3/0089; H01L 21/00
See application file for complete search history.

(56) References Cited

U.S. PATENT DOCUMENTS

| | | |
|---|---|---|
| 4,147,431 A | 4/1979 | Mann |
| 4,826,616 A | 5/1989 | Tanino et al. |
| 5,107,231 A | 4/1992 | Knox |
| 5,198,786 A | 3/1993 | Russell et al. |
| 5,218,373 A | 6/1993 | Heckaman et al. |
| 5,412,186 A | 5/1995 | Gale |

(Continued)

FOREIGN PATENT DOCUMENTS

| | | |
|---|---|---|
| JP | S6428974 A | 1/1989 |
| WO | WO2014037016 A1 | 3/2014 |
| WO | WO2016161215 A1 | 10/2016 |

OTHER PUBLICATIONS

Notification of Transmittal of the International Search Report and the Written Opinion of the Searching Authority, or the Declaration; 6 pages; dated Nov. 15, 2018.

(Continued)

*Primary Examiner* — Su C Kim

(74) *Attorney, Agent, or Firm* — Ebby Abraham; Charles A. Brill; Frank D. Cimino

(57) ABSTRACT

Methods for depositing a measured amount of a species in a sealed cavity. In one example, a method for depositing molecules in a sealed cavity includes depositing a selected number of microcapsules in a cavity. Each of the microcapsules contains a predetermined amount of a first fluid. The cavity is sealed after the microcapsules are deposited. After the cavity is sealed the microcapsules are ruptured to release molecules of the first fluid into the cavity.

20 Claims, 4 Drawing Sheets

(56) References Cited

U.S. PATENT DOCUMENTS

| | | | |
|---|---|---|---|
| 5,459,324 | A | 10/1995 | Fima |
| 5,821,836 | A | 10/1998 | Katehi et al. |
| 6,131,256 | A | 10/2000 | Dydyk et al. |
| 6,236,366 | B1 | 5/2001 | Yamamoto et al. |
| 6,362,706 | B1 | 3/2002 | Song et al. |
| 6,498,550 | B1 | 12/2002 | Miller et al. |
| 6,630,359 | B1 * | 10/2003 | Caillat .............. C12Q 1/001 422/50 |
| 6,670,866 | B2 | 12/2003 | Ella et al. |
| 6,842,088 | B2 | 1/2005 | Yamada et al. |
| 6,989,723 | B2 | 1/2006 | Komuro et al. |
| 6,998,691 | B2 | 2/2006 | Baugh et al. |
| 7,388,454 | B2 | 6/2008 | Ruby et al. |
| 7,408,428 | B2 | 8/2008 | Larson, III |
| 8,098,208 | B2 | 1/2012 | Ficker et al. |
| 8,268,642 | B2 | 9/2012 | Yoshitomi et al. |
| 8,293,661 | B2 | 10/2012 | Yamazaki |
| 8,586,178 | B2 | 11/2013 | Schwanke et al. |
| 9,436,902 | B1 | 9/2016 | Koepp et al. |
| 9,529,334 | B2 | 12/2016 | Herbsommer et al. |
| 9,735,754 | B2 | 8/2017 | Shin et al. |
| 2002/0038989 | A1 | 4/2002 | Larson, III |
| 2002/0068018 | A1 | 6/2002 | Pepper et al. |
| 2002/0098611 | A1 | 7/2002 | Chang et al. |
| 2003/0015707 | A1 | 1/2003 | Bosco et al. |
| 2003/0048500 | A1 | 3/2003 | Fala et al. |
| 2003/0107459 | A1 | 6/2003 | Takahashi et al. |
| 2004/0142484 | A1 | 7/2004 | Berlin et al. |
| 2004/0166577 | A1 * | 8/2004 | Storek ............. B01J 19/0046 435/287.2 |
| 2005/0023932 | A1 | 2/2005 | Inoue et al. |
| 2006/0022761 | A1 | 2/2006 | Abeles |
| 2006/0076632 | A1 | 4/2006 | Palmateer et al. |
| 2006/0144150 | A1 | 7/2006 | Wu |
| 2007/0189359 | A1 | 8/2007 | Chen et al. |
| 2008/0319285 | A1 | 12/2008 | Hancock |
| 2010/0182102 | A1 | 7/2010 | Kuypers et al. |
| 2010/0259334 | A1 | 10/2010 | Briggs |
| 2010/0327701 | A1 | 12/2010 | Grannen et al. |
| 2011/0140971 | A1 | 6/2011 | Schwanke et al. |
| 2012/0266681 | A1 | 10/2012 | Baumann et al. |
| 2013/0176703 | A1 | 7/2013 | Hopper et al. |
| 2014/0155295 | A1 * | 6/2014 | Hindson .............. C12Q 1/6806 506/16 |
| 2014/0210835 | A1 | 7/2014 | Hong et al. |
| 2014/0347074 | A1 | 11/2014 | Nadeau |
| 2014/0368376 | A1 | 12/2014 | Nadeau et al. |
| 2014/0368377 | A1 | 12/2014 | Nadeau et al. |
| 2014/0373599 | A1 | 12/2014 | Trombley |
| 2015/0123748 | A1 | 5/2015 | Stevenson |
| 2015/0144297 | A1 | 5/2015 | Toivonen et al. |
| 2015/0277386 | A1 | 10/2015 | Passilly et al. |
| 2016/0091663 | A1 | 3/2016 | Taylor |
| 2016/0233178 | A1 | 8/2016 | Lamy et al. |
| 2016/0291549 | A1 * | 10/2016 | Herbsommer ......... G01N 29/36 |
| 2017/0073223 | A1 | 3/2017 | Nasiri et al. |
| 2017/0125660 | A1 | 5/2017 | Stephanou et al. |
| 2017/0130102 | A1 * | 5/2017 | Campbell ............... C09J 11/04 |
| 2018/0159547 | A1 | 6/2018 | Herbsommer et al. |

OTHER PUBLICATIONS

PCT Search Report, PCT/US2018/049940; dated Dec. 13, 2018, 7 pages.

PCT Search Report, PCT/US2018/049949; dated Dec. 13, 2018, 7 pages.

Notification of Transmittal of the International Search Report and the Written Opinion of the International Searching Authority, or the Declaration; "PCT Search Report PCT/US2018/050253"; dated Jan. 10, 2019; 7 pages.

Alvarez, A.L. et al; "The Application of Microencapsulation Techniques in the Treatment of Endodontic and Periodontal Diseases" Pharmaceutics; 2011 abstract p. 540-548.

Steinberg D. et al; "A New Degradable Controlled Release Device for Treatment of Periodontal Disease: In Vitro Release Study"; J. Periodontology; 1990; p. 393 lines 1-17; p. 394 col. 1 lines 5-14.

Xiong R. et al.; "Towards Theranostic Multicompartment Microcapsules: in situ Diagnostics and Laser-induced Treatment", Theranostics; 2013; pp. 145-149.

Notification of Transmittal of the International Search Reort and the Written Opinion of the International Searching Authority, or the Declaration; dated Dec. 27, 2018; 7 pages; PCT/US2018/049955.

PCT Search Report, PCT/US 2018/047105; dated Dec. 27, 2018, 7 pages.

PCT Search Report, PCT/US 2018/049943; dated Dec. 27, 2018, 8 pages.

* cited by examiner

METHODS FOR DEPOSITING A MEASURED AMOUNT OF A SPECIES IN A SEALED CAVITY

BACKGROUND

Various applications require that a sealed chamber contain a specific molecular species and the species be contained at a specific pressure and quantity. The conditions under which the chamber is constructed may preclude the presence of the species, and introduction of the species after the chamber is constructed and sealed may be difficult or impossible. In one particular application, the waveguide of a chip-scale atomic clock contains a vapor of selected molecular composition. The molecules may be reactive and accordingly, the molecules may not be present during fabrication of the waveguide.

SUMMARY

Various methods for depositing a measured amount of a species in a sealed chamber are disclosed herein. In one embodiment, a method for depositing molecules in a sealed cavity includes depositing a selected number of microcapsules in a cavity. Each of the microcapsules contains a predetermined amount of a first fluid. The cavity is sealed after the microcapsules are deposited. After the cavity is sealed the microcapsules are ruptured to release molecules of the first fluid into the cavity.

In another embodiment, a method for depositing molecules in a sealed cavity includes forming a cavity in a substrate material. A film is deposited on a surface of the cavity. The cavity is sealed after the film is deposited. After the cavity is sealed, the film is degraded to form molecules of a vapor in the sealed cavity.

In a further embodiment, a method for depositing molecules in a sealed cavity includes forming a cavity in a substrate material. A getter material is deposited on a surface of the cavity. The getter material is exposed to molecules of a vapor. The getter material adsorbs the molecules. The vapor is evacuated from the cavity. The cavity is sealed after the vapor is evacuated from the cavity. The molecules are released from the getter material to provide molecules of the vapor in the sealed cavity. In some embodiments, the getter material is selectively activated to provide a reversible process, thereby allowing active feedback and control of the amount of the vapor sealed in the cavity to normalize pressure across temperature.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

Various fabrication processes require a controlled environment that is free from airborne particulates and other contaminates that may affect the product being manufactured. For example, semiconductors, such as integrated circuits and microelectromechanical systems are fabricated in a clean room where the environment is tightly controlled to prevent contamination. However, some products necessarily include substances, such as vapors, that are typically excluded from the semiconductor fabrication environment because the substances are considered contaminants. For example, the frequency of a millimeter wave chip scale atomic clock (mmwCSAC) is based on the frequency of quantum rotation of dipolar molecules that are considered contaminants and therefore excluded from a conventional semiconductor fabrication environment. Accordingly, manufacture of devices that include substances that are typically barred from conventional semiconductor fabrication processes is problematic.

Embodiments of the present disclosure provide for deposition of molecules that would typically be excluded from the semiconductor manufacturing environment in a cavity of a device under construction. Deposition of the molecules in a high volume manufacturing environment may be exceedingly difficult using conventional manufacturing processes. In the methods disclosed herein, the molecules are held in the cavity in various non-vaporous forms prior to the cavity being sealed. After the cavity is sealed the molecules are released to form a vapor. The pressure in the sealed cavity is controlled by predetermining the quantity of molecules to be released after the cavity is sealed, and, prior to sealing the cavity, depositing material in the cavity sufficient to provide the predetermined quantity of molecules after the cavity is sealed. In some embodiments, the molecules are released from microcapsules that are deposited in the cavity prior to the cavity being sealed. In other embodiments, the molecules are formed by degrading a precursor material or released from a getter material that is deposited in the cavity prior to the cavity being sealed.

Figure 1:
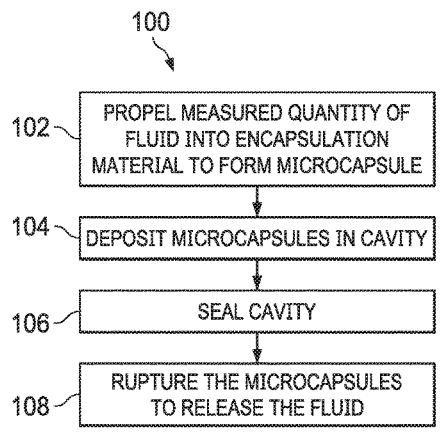
FIG. 1 shows a flow diagram for a method for depositing a vapor in a cavity in accordance with various embodiments.

FIG. 1 shows a flow diagram for a method 100 for depositing a vapor in a cavity in accordance with various embodiments. Though depicted sequentially as a matter of convenience, at least some of the actions shown can be performed in a different order and/or performed in parallel. Additionally, some implementations may perform only some of the actions shown.

The method 100 allows a measured amount of a fluid to be deposited within a cavity, before the cavity is sealed, without exposing the manufacturing environment or the unsealed cavity to the fluid. In embodiments of the method 100, the fluid is encapsulated prior to deposition in the cavity. The encapsulation isolates the fluid from the manufacturing environment. Otherwise, the vapor molecules ultimately deposited in the cavity would most probably not survive the manufacturing process. FIGS. 2A-2D illustrate operations of the method 100 and are referred to in describing the operations of the method 100.

In block 102, fluid to be deposited in the cavity is encapsulated. In some embodiments encapsulation includes propelling a measured quantity of a selected fluid into an encapsulation material (e.g., an encapsulation fluid), such as a liquid polymer, to form a microcapsule that includes the measured quantity of the fluid encased in an encapsulating shell. The encapsulation material is selected to maintain the integrity of the microcapsules in the manufacturing environment applied in the method 100 at least until the cavity is sealed. The precise amount of the fluid propelled into the encapsulation material is known, and accordingly, the precise amount of fluid contained in each microcapsule is known. In some embodiments, molecules of the fluid are dipolar. In some embodiments, the fluid is water.

Figure 2A:
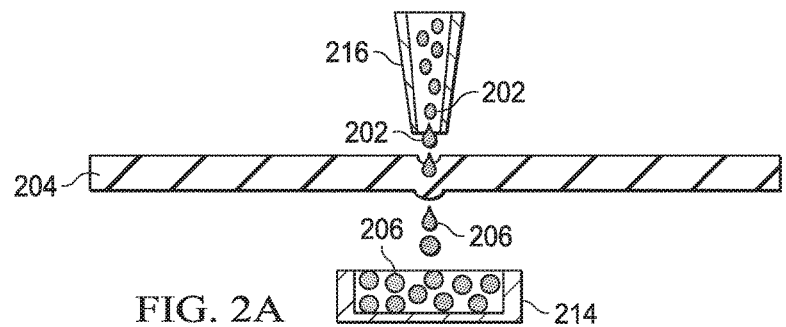
FIGS. 2A-2D illustrate operations of the method of FIG. 1 in accordance with various embodiments.

FIG. 2A shows encapsulation of the fluid 202 in block 102. Droplets of the fluid 202, each droplet including a measured amount of the fluid 202, are propelled from a nozzle 216 into the encapsulation material 204. In some embodiments, the nozzle 216 is similar to an inkjet nozzle. As each droplet of the fluid 202 passes through the encapsulation material 204, the encapsulation material 204 surrounds the fluid 202 to form a microcapsule 206. The microcapsules 206 are collected in a container 214. In some embodiments, the encapsulation of the fluid 202 is performed outside of the semiconductor manufacturing environment.

Figure 2B:
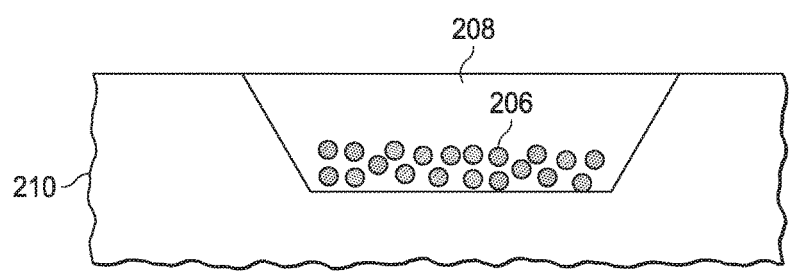

In block 104, a measured number of the microcapsules formed in block 102 are deposited in a cavity. Because the amount of fluid contained in each of the microcapsules in known, the total amount of fluid deposited in the cavity is known. Because the fluid is encapsulated, the manufacturing environment is not subject to contamination by the fluid. The number of microcapsules deposited in the cavity is selected to provide an amount of the fluid needed to obtain a predetermined pressure in the cavity after the fluid is released from the microcapsules as vapor. In some embodiments, the cavity is formed in a semiconductor substrate. In some embodiments, the cavity forms a waveguide of a millimeter wave chip scale atomic clock constructed via a microelectromechanical system (MEMS) fabrication process. FIG. 2B shows microcapsules 206 deposited in the cavity 208 formed in substrate 210.

Figure 2C:
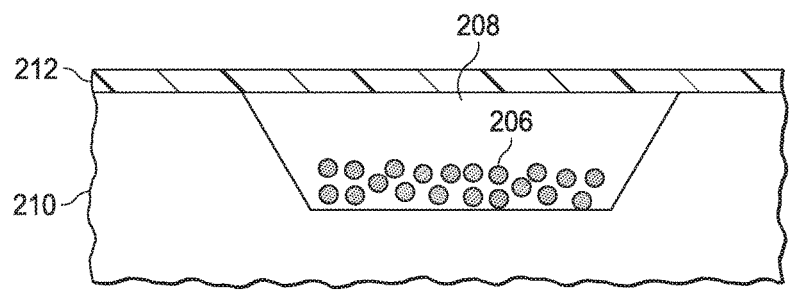

In block 106, the cavity is sealed with the intact microcapsules therein. FIG. 2C shows a sealing structure 212 applied to and enclosing the cavity 208. The intact microcapsules 206 are contained within the sealed cavity 208. In some embodiments, the sealing structure 212 is a sheet of material, such as glass or semiconductor material that is bonded to the substrate 210. In some embodiments, at the time that the cavity is sealed, the internal pressure of the cavity is such that on release of the fluid from the microcapsules the pressure within the cavity will rise to a predetermined level. For example, in some embodiments, molecules of gas within the cavity 208 are be evacuated prior to the sealing to provide a very low pressure within the sealed cavity 208 of FIG. 2C.

In block 108, the microcapsules enclosed in the sealed cavity are ruptured to release into the sealed cavity as vapor the fluid contained in the microcapsules. Embodiments employ various techniques to degrade the outer shell of the microcapsules to the point of rupture. Some embodiments heat the microcapsules to a temperature that degrades the outer shell of the microcapsules. Such a temperature will generally be higher than temperatures to which the microcapsules are exposed during other manufacturing operations to ensure that the microcapsules do not rupture prematurely. Some embodiments expose the microcapsules to ultraviolet or infrared radiation that degrades the outer shell of the microcapsules to the point of rupture. Some embodiments apply a different stimulant (e.g., laser light) to the microcapsules to release the fluid.

Figure 2D:
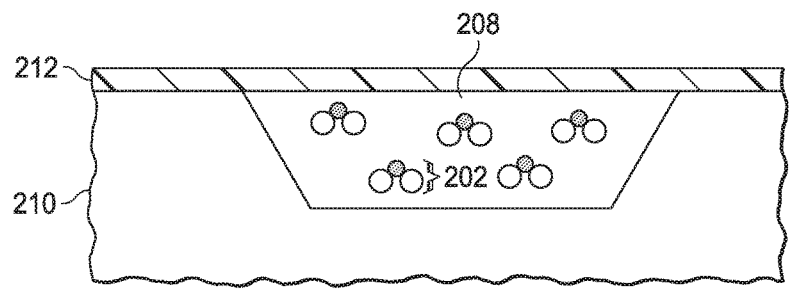

FIG. 2D shows the cavity 208 after the microcapsules 206 have been ruptured. The fluid 202 has escaped from the microcapsules and molecules of the fluid 202 are in a vapor form within the cavity 208. The cavity 208 will also contain remnants of the microcapsule shells. In various applications (e.g., an mmwCSAC) such remnants have little or no effect of the operation of the device including the cavity 208.

Figure 3:
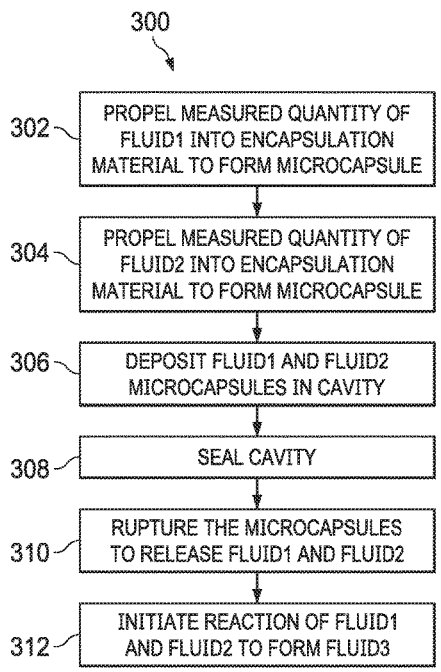
FIG. 3 shows a flow diagram for a method for depositing a vapor in a cavity in accordance with various embodiments.

FIG. 3 shows a flow diagram for a method 300 for depositing a vapor in a cavity in accordance with various embodiments. Though depicted sequentially as a matter of convenience, at least some of the actions shown can be performed in a different order and/or performed in parallel. Additionally, some implementations may perform only some of the actions shown.

The operations of the method 300 are similar to the operations of the method 100. Accordingly, FIGS. 2A-2D illustrate operations of the method 200 and are referred to in describing the operations of the method 100. The method 300 differs from the method 100 in that in the method 300 multiple encapsulated fluids are deposited in a cavity. After the fluids are released from encapsulation in vapor form, molecules of the vapors react to form the molecules ultimately intended to occupy the cavity.

In block 302, a first fluid to be deposited in the cavity is encapsulated. In some embodiments encapsulation includes propelling a measured quantity of the first fluid into an encapsulation material (e.g., an encapsulation fluid), such as a liquid polymer, to form a microcapsule that contains the measured quantity of the first fluid. The encapsulation material is selected to maintain the integrity of the microcapsules in the manufacturing environment applied in the method 300 at least until the cavity is sealed. The precise amount of the first fluid propelled into the encapsulation material is known, and accordingly, the precise amount of first fluid contained in each microcapsule is known.

In block 304, a second fluid to be deposited in the cavity is encapsulated. In some embodiments encapsulation includes propelling a measured quantity of the second fluid into an encapsulation material (e.g., an encapsulation fluid), such as a liquid polymer, to form a microcapsule that contains the measured quantity of the second fluid. The encapsulation material is selected to maintain the integrity of the microcapsules in the manufacturing environment applied in the method 300 at least until the cavity is sealed. The precise amount of the second fluid propelled into the encapsulation material is known, and accordingly, the precise amount of second fluid contained in each microcapsule is known.

FIG. 2A shows encapsulation of droplets of fluid by jetting the fluid into an encapsulation material. The fluid jetted into the encapsulation material is the first fluid of block 302 or the second fluid of block 304. The microcapsules of each fluid are collected for deposition in a cavity.

In block 306, a measured number of the microcapsules of the first fluid and a measured number of the microcapsules of the second fluid formed are deposited in a cavity. Because the amount of fluid contained in each of the microcapsules in known, the total amount of each type of fluid deposited in the cavity is known. The number of microcapsules deposited in the cavity is selected to provide an amount of the fluids needed to obtain a predetermined pressure in the cavity after the fluids are released from the microcapsules to form a target fluid by reaction. In some embodiments, the cavity is formed in a semiconductor substrate. In some embodiments, the cavity forms a waveguide of a millimeter wave chip scale atomic clock constructed via a MEMS fabrication process. FIG. 2B shows microcapsules 206 deposited in the cavity 208 formed in substrate 210. The microcapsules 206 include microcapsules of the first fluid and microcapsules of the second fluid.

In block 308, the cavity is sealed with the intact microcapsules therein. In some embodiments, cavity is sealed by bonding a sheet of material, such as glass or semiconductor material to the substrate in which the cavity is formed. FIG. 2C shows a sealing structure 212 applied to and enclosing the cavity 208 and the microcapsules of the first and second fluid contained therein. In some embodiments, at the time that the cavity is sealed, the internal pressure of the cavity is such that on release and reaction of the fluid from the microcapsules the pressure within the cavity will rise to a predetermined level. For example, in some embodiments, molecules of gas within the cavity 208 are evacuated prior to the sealing to provide a very low pressure within the sealed cavity 208 of FIG. 2C.

In block 310, the microcapsules enclosed in the sealed cavity are ruptured to release the first fluid and the second fluid from the microcapsules into the cavity in vapor form. Embodiments employ various techniques to degrade the outer shell of the microcapsules to the point of rupture. Some embodiments heat the microcapsules to a temperature that degrades the outer shell of the microcapsules. Such a temperature will generally be higher than temperatures to which the microcapsules are exposed during other manufacturing operations to ensure that the microcapsules are not ruptured prematurely. Some embodiments expose the microcapsules to ultraviolet radiation. Laser light, or other stimulus that degrades the outer shell of the microcapsules.

In block 312, vapor molecules of the first fluid and the second fluid react to form vapor molecules of a third fluid in the cavity, where the third fluid is the species ultimately desired in the cavity. In some embodiments, the vapor molecules of the first and second fluids have separate absorption peaks within the bandwidth of a system utilizing the cavity. In some embodiments, the vapor molecules of the first and second fluids are exposed to heat, ultraviolet radiation, or other stimulus to initiate reaction of the molecules. In some embodiments, vapor molecules of the third fluid are dipolar. FIG. 2D shows the cavity 208 after the microcapsules of the first and second fluids have been ruptured, and the vapor molecules of the first and second fluids have reacted form vapor molecules of a third fluid 202 in the cavity 208. In some embodiments, vapor molecules of the third fluid are dipolar. In some embodiments, the third fluid is water.

Figure 4:
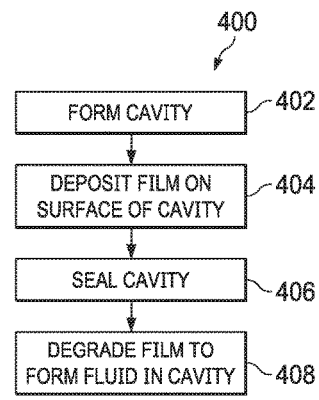
FIG. 4 shows a flow diagram for a method for depositing a vapor in a cavity in accordance with various embodiments.

FIG. 4 shows a flow diagram for a method 400 for depositing a vapor in a sealed cavity in accordance with various embodiments. Though depicted sequentially as a matter of convenience, at least some of the actions shown can be performed in a different order and/or performed in parallel. Additionally, some implementations may perform only some of the actions shown.

The method 400 allows a measured amount of a vapor to be deposited within a cavity after the cavity is sealed, by decomposing a precursor material deposited in the cavity prior to sealing. FIGS. 5A-5D illustrate operations of the method 400 and are referred to in describing the operations of the method 400.

Figure 5A:
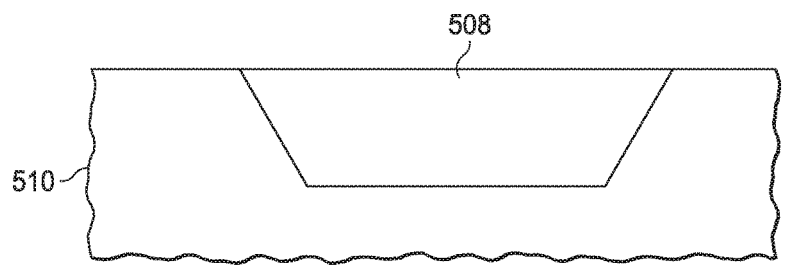
FIGS. 5A-5D illustrate operations of the method of FIG. 4 in accordance with various embodiments.

In block 402, a cavity is formed in a substrate material. In some embodiments, the substrate is semiconductor material and the cavity is etched in the substrate material using semiconductor manufacturing processes. In some embodiments, the cavity forms a waveguide of a millimeter wave chip scale atomic clock constructed via a MEMS fabrication process. FIG. 5A shows formation of the cavity 508 in the substrate 510.

In block 404, a film is deposited on the surface of the cavity. The film is a precursor material that can be decomposed after the cavity is sealed to form desired molecules in the cavity. In some embodiments, the film includes aluminum hydroxide or an organic compound.

The film may include polymers of the target molecules that depolymerize upon thermal treatment to produce the desired small amount of target gas. Examples include polymers of hydrocyanic acid, cyanoacetylene, cyanodiacetylene, and the like, as well as polymers of formaldehyde (i.e., poly(oxomethylene)). The film may also include copolymers of the desired molecules with other moieties. Examples of these include alt(alkylene-glycol-carbonyl-sulfide) or alt (alkylene-glycol-carbonyl-selenide) polymers, polymers which contain Diels-Alder adducts of such desired gasses as COS, COSe, $SO_2$ and the like. Further examples include poly(chlorotrifluoroethylene) (PCTFE) and poly(vinylidene fluoride) PVDF.

Another class of materials which may be useful include inorganic salts that can rearrange or react at moderate temperatures to produce a desired target molecule. One example is ammonium nitrate ($NH_4NO_3$) which rearranges at elevated temperature to produce nitrous oxide $N_2O$ and water. Water expelled in such a rearrangement reaction may be absorbed by a desiccant included in the film or elsewhere in the package. Suitable desiccants include oxides of boron and phosphorous, as well as specific drying agents such as magnesium perchlorate. Another suitable desiccant may be sulfuric acid.

Other useful precursors that eliminate water include oximes that dehydrate to cyano compounds. In other cases, water may be included in absorbed or adsorbed form, released as a catalyst for a desired chemical transformation at elevated temperature, and readsorbed or reabsorbed at ordinary temperatures.

Other embodiments include those in which a hydrohalic acid gas is released from a polymeric or thin-film material. Still further embodiments include those in which a polyfluorosilane may be released from a polymeric or thin-film material. Embodiments may also include functionalized or capped polymeric and/or inorganic films, such as might be formed from a thin film oxide and a chlorinated or brominated derivative of a (poly)fluorosilane, (poly)fluorogermane, etc. or from a polyfluorosilane or polyfluorogermane or similar compound.

Figure 5B:
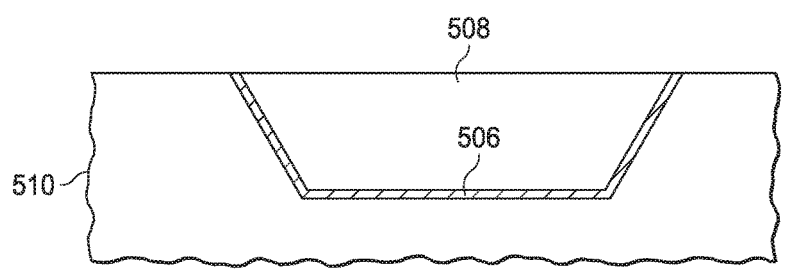

FIG. 5B shows a layer of precursor material 506 deposited on the surface of the cavity 508. Some embodiments deposit the layer of precursor material 506 in the cavity 508 using semiconductor manufacturing processes. Because the amount of precursor material deposited is known, the amount of vapor produced by decomposition of the precursor material is also known. The amount of precursor material deposited is predetermined to result in a desired amount of vapor in the cavity after decomposition.

Figure 5C:
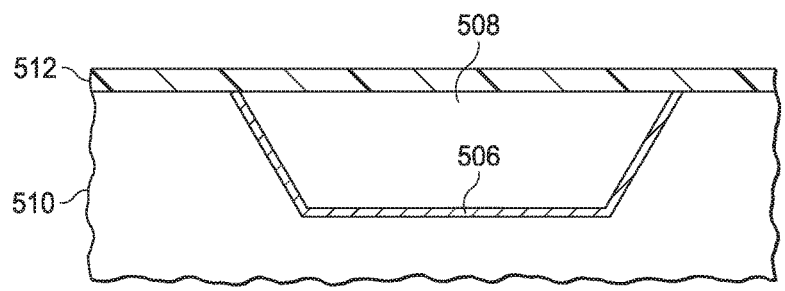

In block 406, the cavity is sealed. In some embodiments, the cavity is sealed by bonding a sheet of material, such as glass, an insulation material, or semiconductor material to the substrate in which the cavity is formed. FIG. 5C shows a sealing structure 512 applied to and enclosing the cavity 508 and the film 506 contained therein. In some embodiments, at the time that the cavity is sealed, the internal pressure of the cavity is such that with the formation of vapor molecules from the precursor material the pressure within the cavity will rise to a predetermined level. For example, some embodiments evacuate molecules of gas within the cavity 508 prior to the sealing to provide a very low pressure within the sealed cavity 508 of FIG. 5C.

Figure 5D:
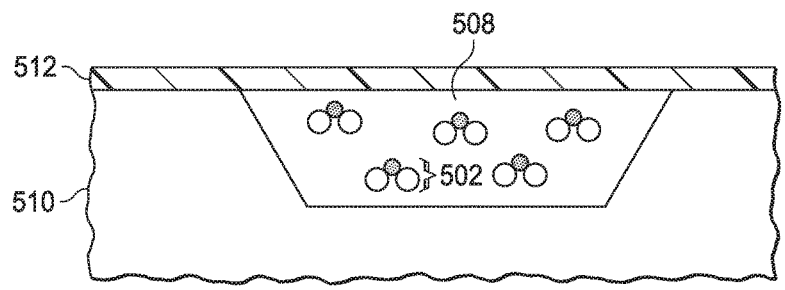

In block 408, the precursor material deposited in the cavity is decomposed to form molecules of the desired vapor in the cavity. Embodiments employ various techniques to decompose the precursor material. Some embodiments heat the precursor material to a temperature sufficient produce a reaction in the precursor material. Some embodiments expose the precursor material to ultraviolet radiation to decompose the film. FIG. 5D shows the cavity 508 after the film 506 has been decomposed. Molecules 502 of a desired vapor produced by degrading the film 506 are in a vapor form within the cavity 508. In some embodiments, the molecules 502 are dipolar molecules. In some embodiments, the molecules 502 are water molecules.

Figure 6:
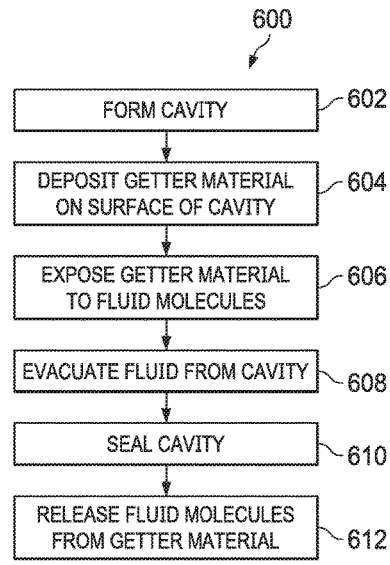
FIG. 6 shows a flow diagram for a method for depositing a vapor in a cavity in accordance with various embodiments.

FIG. 6 shows a flow diagram for a method 600 for depositing a vapor in a sealed cavity in accordance with various embodiments. Though depicted sequentially as a matter of convenience, at least some of the actions shown can be performed in a different order and/or performed in parallel. Additionally, some implementations may perform only some of the actions shown.

The method 600 allows a measured amount of a vapor to be deposited within a cavity after the cavity is sealed by releasing vapor molecules from a getter material deposited in the cavity. FIGS. 7A-7E illustrate operations of the method 600 and are referred to in describing the operations of the method 600.

Figure 7A:
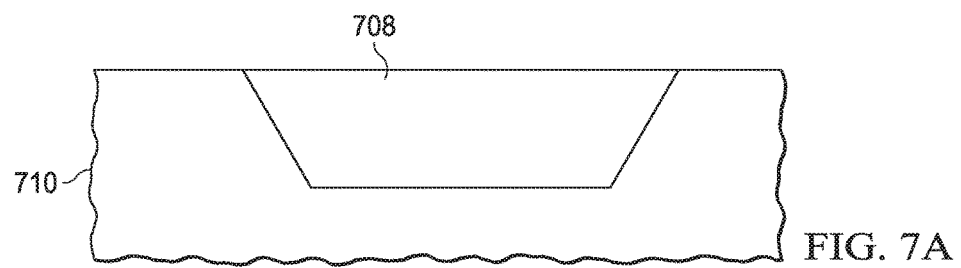
FIGS. 7A-7E illustrate operations of the method of FIG. 6 in accordance with various embodiments.

In block 602, a cavity is formed in a substrate material. In some embodiments, the substrate is semiconductor material and the cavity is etched in the substrate material using semiconductor manufacturing processes. In some embodiments, the cavity forms a waveguide of a millimeter wave chip scale atomic clock constructed via a MEMS fabrication process. FIG. 7A shows formation of the cavity 708 in the substrate 710.

Figure 7B:
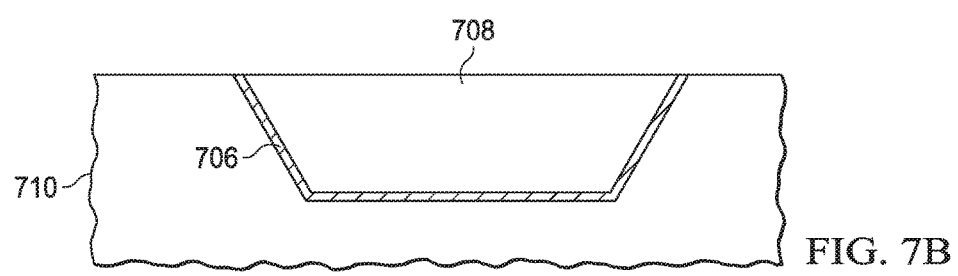

In block 604, a layer of getter material is deposited on the surface of the cavity. The getter material is selected to adsorb molecules of a vapor desired in the cavity, and retain the molecules at least until the cavity is sealed. Examples getter materials deposited in the cavity include silicon nitrides, aluminum oxides, titanium oxides, zirconium, and vanadium. FIG. 7B shows a layer of getter material 706 deposited on the surface of the cavity 708. The layer of getter material 706 is deposited in the cavity 508 using semiconductor manufacturing processes. Because the amount of getter material deposited in known, the amount of vapor released from the getter material is also known. The amount of getter material deposited is predetermined to result in a desired amount of vapor in the cavity after the cavity is sealed.

Figure 7C:
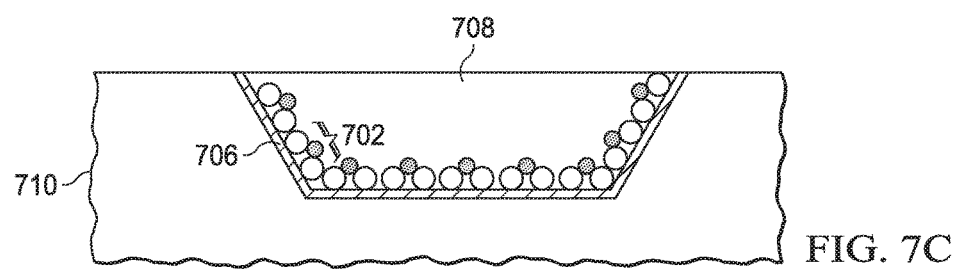

In block 606, the getter material deposited in the cavity is exposed to the vapor to be adsorbed. For example, in some embodiments, the getter material 706 is exposed to water vapor. In some embodiments, exposure to the vapor is isolated to the cavity 708. FIG. 7C shows molecules of vapor 702 accumulated on the layer of getter material 706.

In block 608, after the getter material has been exposed to the vapor, vapor not adsorbed by the getter material 706 is evacuated from the cavity 708. For example, some embodiments employ a vacuum pump to remove water vapor from the cavity 708.

Figure 7D:
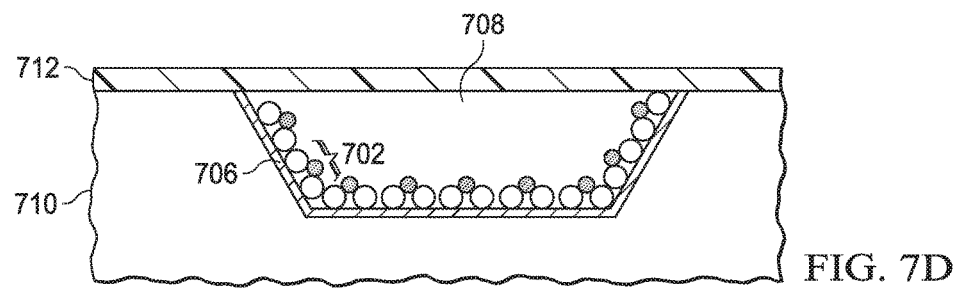

In block 610, the cavity is sealed. In some embodiments, the cavity is sealed by bonding a sheet of material, such as glass or semiconductor material to the substrate in which the cavity is formed. FIG. 7D shows a sealing structure 712 applied to and enclosing the cavity 708. In some embodiments, at the time that the cavity is sealed, the internal pressure of the cavity is such that with the release of vapor molecules from the getter material the pressure within the cavity will rise to a predetermined level. For example, some embodiments evacuate molecules of gas within the cavity 708 prior to the sealing to provide a very low pressure within the sealed cavity 708 of FIG. 7D.

Figure 7E:
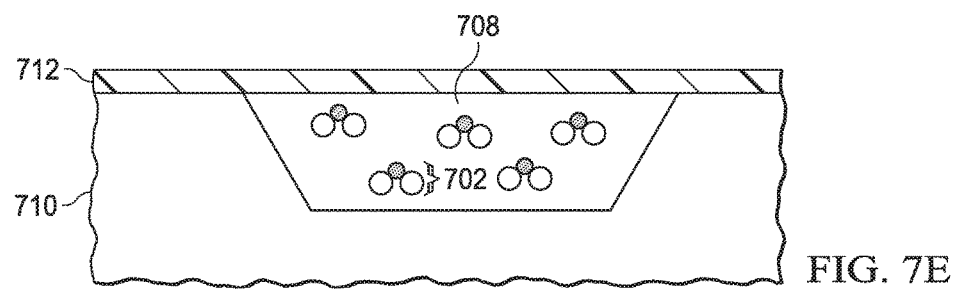

In block 612, the molecules of the vapor held by the getter material are released to form a vapor in the cavity. Embodiments employ various techniques cause the getter material to release the adsorbed vapor molecules. Some embodiments heat the getter material to a temperature sufficient to initiate the release of the molecules. Such a temperature will generally be higher than temperatures to which the getter material is exposed during other manufacturing operations to ensure that the getter material does not release vapor prematurely. Some embodiments apply optical or electrical energy to the getter material to initiate release of the vapor molecules. FIG. 7E shows the cavity 708 after the getter material 706 has released the molecules of vapor 702. In some embodiments, the molecules of vapor 702 are dipolar molecules. In some embodiments, the molecules of vapor 702 are water molecules.

In some embodiments, the getter material is selectively activated after release of the vapor molecules in block 612 to provide a reversible process, thereby allowing active feedback and control of the amount of the vapor sealed in the cavity to normalize pressure across temperature.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
   depositing a microcapsule in a cavity of a semiconductor substrate, wherein the microcapsule contains an amount of a fluid;
   sealing the cavity after the microcapsule is deposited; and
   rupturing, after the cavity is sealed, the microcapsule to release molecules of the fluid into the cavity.

2. The method of claim 1, further comprising setting, prior to the sealing, pressure in the cavity to be less than a desired pressure in the cavity after the rupturing.

3. The method of claim 1, wherein the rupturing comprises heating the microcapsule to a temperature greater than a temperature applied to seal the cavity to degrade an outer shell of the microcapsule.

4. The method of claim 1, wherein the rupturing comprises exposing the microcapsule to ultraviolet radiation, infrared radiation, or laser light to degrade an outer shell of the microcapsule.

5. The method of claim 1, further comprising propelling a first amount of the fluid into an encapsulating fluid to form the microcapsule.

6. The method of claim 1, further comprising:
depositing a second microcapsule in the cavity, wherein the second microcapsule contains an amount of a second fluid;
rupturing, after the cavity is sealed, the second microcapsule to release the second fluid into the cavity;
wherein molecules of the first fluid and the second fluid react to form molecules of a third fluid.

7. The method of claim 6, further comprising applying heat, ultraviolet radiation, infrared radiation, or laser light to the molecules of the first fluid and the molecules of the second fluid to initiate a reaction that forms the molecules of the third fluid.

8. A method, comprising:
forming a cavity semiconductor in a substrate material;
depositing a film on a surface of the cavity;
sealing the cavity after the film is deposited; and
decomposing the film to form molecules of a vapor in the sealed cavity.

9. The method of claim 8, further comprising setting, prior to the sealing, pressure in the cavity to be less than a desired pressure in the cavity after the decomposing.

10. The method of claim 8, wherein the decomposing comprises heating the film to a temperature greater than a temperature applied to seal the cavity.

11. The method of claim 8, wherein the decomposing comprises exposing the film to ultraviolet radiation.

12. The method of claim 8, wherein the film comprises aluminum hydroxide or an organic compound.

13. The method of claim 8, wherein the vapor comprises dipolar molecules.

14. A method comprising:
forming a cavity semiconductor in a substrate material;
depositing a getter material on a surface of the cavity;
exposing the getter material to molecules of a vapor, wherein the getter material adsorbs the molecules;
evacuating the vapor from the cavity;
sealing the cavity after the vapor is evacuated from the cavity; and
releasing the molecules from the getter material to provide molecules of the vapor in the sealed cavity.

15. The method of claim 14, further comprising setting, prior to the sealing, pressure in the cavity to be less than a desired pressure in the cavity after the releasing.

16. The method of claim 14, wherein the releasing comprises heating the getter material to a temperature that is greater than a temperature applied to seal the cavity.

17. The method of claim 14, wherein the releasing comprises applying optical energy or electrical energy to the getter material.

18. The method of claim 14, further comprising, after releasing the molecules from the getter material, activating the getter material to adsorb molecules of the vapor.

19. The method of claim 14, wherein the molecules are dipolar.

20. The method of claim 14, wherein the cavity is a waveguide of a millimeter wave atomic clock.

* * * * *